United States Patent [19]

Champagne

[11] 4,017,800
[45] Apr. 12, 1977

[54] DELINEARIZATION CIRCUIT
[75] Inventor: Ronald E. Champagne, Westfield, Mass.
[73] Assignee: General Instrument Corporation, Clifton, N.J.
[22] Filed: Apr. 29, 1975
[21] Appl. No.: 572,763
[52] U.S. Cl. .............................. 325/464; 235/183; 328/127
[51] Int. Cl.² ...................... H03J 3/06; G06G 7/18
[58] Field of Search ............... 235/193.5, 180, 183, 235/186, 193, 194; 307/229, 240; 325/464; 328/142, 143, 144, 127; 330/9, 10, 51; 340/347 DA, 347 CC; 334/14, 15

[56] References Cited
UNITED STATES PATENTS

| | | | |
|---|---|---|---|
| 2,931,985 | 4/1960 | Offner | 330/10 |
| 3,237,117 | 2/1966 | Collings et al. | 330/10 X |
| 3,399,358 | 8/1968 | Rinehart | 330/9 X |
| 3,528,043 | 8/1970 | Richter et al. | 325/464 X |
| 3,624,638 | 11/1971 | Riseman | 235/183 X |
| 3,676,661 | 7/1972 | Sprowl | 235/193.5 |
| 3,842,416 | 10/1974 | Eto | 235/183 X |

Primary Examiner—Benedict V. Safourek

[57] ABSTRACT

The delinearization circuit includes a first analog switch which is switchable in accordance with the duty cycle of the pulses in an input pulse train, between a given voltage and ground, to form a pulse train of constant amplitude. An intermediate signal is formed by time averaging the output of the first switch. A second analog switch, switchable in accordance with the duty cycle of the input pulse train between the intermediate signal and ground, forms a second pulse train which is time averaged to provide an output signal proportional to the square of the amplitude of the input signal pulse train. In a second embodiment of the invention, a maximum value circuit is utilized to select the greater of the intermediate signal and a reference voltage and the second switch is switched between the selected signal and ground. Through the proper selection of the value of the reference voltage, the desired switchover point can be obtained such that the amplitude of the output signal is linearly proportional to the input pulse train for a selected portion of the range thereof and is proportional to the square of the input pulse train for the remainder of the range thereof.

13 Claims, 5 Drawing Figures

DELINEARIZATION CIRCUIT

The present invention relates to delinearization circuits, and in particular to a delinearization circuit which has an output characteristic proportional to an integral power of an input pulse train over the entire output range or a portion thereof.

A delinearization circuit is a circuit having an output characteristic which has a given non-linear mathematical relationship with the input signal. The relationship is dependent upon the circuit design, which, in turn, is developed to perform the delinearization function for a particular application or a set of applications requiring this mathematical relationship between input and output. Such circuits have utility in various types of apparatus and, for instance, are particularly useful to compensate for the non-linearity of the voltage controlled diodes in a varactor tuner.

A varactor tuner, unlike conventional electro-mechanical tuners having mechanically gang tuned capacitance or inductance elements, utilizes voltage controlled diodes or varactors whose capacitance varies in accordance with the voltage applied thereto. The variable capacitance elements are utilized to tune a resonant circuit to select a particular frequency. Unfortunately, the variations in the capacitance of the voltage controlled diodes are not linearly proportional to the changes in the input voltage throughout the range thereof. In fact, these variations are approximately proportioned to the square of the input voltage signal throughout at least a portion of the capacitance range of the diodes.

In previous "analog" methods of electronic tuning, which incorporated a complex network of accurately valued potentiometers which were selectively switched into a circuit to provide the varactor tuning voltage, the direct application of voltages from the potentiometers resulted in each potentiometer being more sensitive at one end of its resistance range than at the other because of the non-linear response of the tuner. While non-linear potentiometers could be used in this regard, precision of the tuning still depended upon the accuracy of the value of the resistances and changes in the values thereof due to environmental conditions such as temperature and humidity variations, could not be tolerated. Thus, new methods for producing the necessary varactor tuning voltage have been developed in which information is processed in a digital fashion and thereafter converted into an analog tuning voltage. In such a system, it is desirable to incorporate a delinearization circuit to compensate for the non-linearity of the varactor tuner. Such a circuit must be compatible with the remainder of the system, as well as being reliable, inexpensive and versatile.

It is, therefore, a prime object of the present invention to provide a delinearization circuit which can be manufactured of exclusively solid state components easily fabricated by integrated circuit techniques.

It is another object of the present invention to provide a delinearization circuit made up of solid state components which does not vary appreciably with environmental changes, such as changes in temperature and humidity.

It is a further object of the present invention to provide a delinearization circuit made of solid state components which can be reliably and inexpensively mass produced.

It is still another object of the present invention to provide a delinearization circuit which can incorporate a switching circuit such that the output can have different proportionality factors over different portions of its range.

It is a still further object of the present invention to provide a delinearization circuit capable of achieving a proportionality factor of any integral power by the appropriate duplication of stages.

In accordance with the present invention, the delinearization circuit includes a first stage comprising a first switch means switchable in accordance with an input signal, between a given supply voltage and a reference voltage, to form a first signal. Means are provided for forming from the first signal an intermediate signal which is the function of the first signal. The second stage includes a second switch switchable in accordance with the input signal between the intermediate signal and a reference voltage, to form an output signal. If the intermediate signal is the time average of the first signal, then the output signal of the second stage will be proportional to the square of the input signal, throughout the range of the output signal.

In actuality, the varactor tuner is non-linear in accordance with a square law curve only through approximately the upper half of its range and approximately linear throughout the lower half thereof. Thus, in some cases, it is preferable to produce an output signal which is linearly proportional to the input signal throughout a portion of the range of the output signal and non-linear thereafter. In those instances, means for selecting the greater of the intermediate signal and a constant voltage from a voltage source is interposed between the stages of the circuit, namely between the intermediate signal forming means and the second switch means. In this manner, the output of the second switch means will be linear through a portion thereof and non-linear thereafter. The switchover point between the linear and the non-linear portions of the output range will be determined by the magnitude of the voltage from the voltage source.

To the accomplishment of the above and to such other objects as may hereinafter appear, the present invention relates to a delinearization circuit as defined in the appended claims and as described in the specification taken together with the accompanying drawings in which:

While the delinearization circuit of the present invention is of quite general application and use, it will be here described as designed for a particular use, to wit, in a varactor type tuner. That is, however, but exemplary of its versatility.

Figure 1:
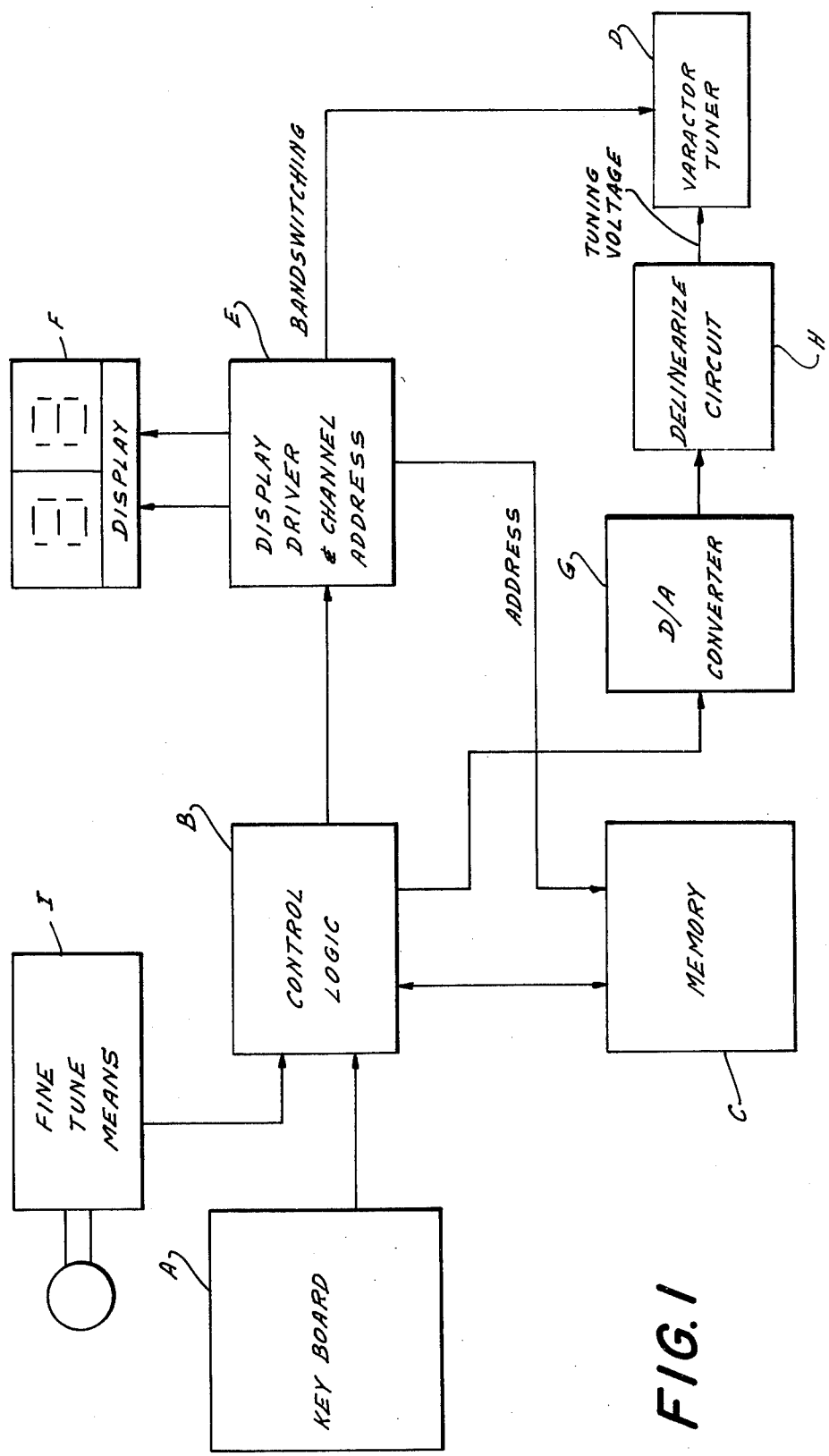
FIG. 1 is a block diagram of an electronic tuning system utilizing the delinearization circuit of the present invention.

As shown in FIG. 1, the all electronic tuning apparatus incorporating the delinearization circuit of the present invention is designed for use in a communications systems of the type having a tuning signal controlled tuning element. Such tuning element may, for instance, be a varactor tuning having a number of diodes, the capacitance of which vary non-linearly with voltage applied thereto, at least through a portion of the operating range. In particular, the capacitance of the voltage controlled diodes in the conventional varactor tuner varies approximately linearly with the tuning voltage throughout approximately the lower half of the output range thereof. Thereafter, namely, in the upper half of the output range, the capacitance of the diode varies approximately proportionally to the square of the tuning voltage.

This system which is described in detail in application Ser. No. 565,121, filed Apr. 14, 1975 in the name of Louis-Pierre Zimmerman as inventor entitled ALL ELECTRONIC TUNING SYSTEM WITH SEMICONDUCTOR MEMORY and assigned to the assignee of the present invention, comprises an input signal generating means, illustrated here as keyboard A, which preferably takes the form of an array of pushbuttons and which may be actuated by depressing or manipulating the appropriate pushbuttons, to generate a channel select signal to a control logic circuit, generally designated B.

Control logic circuit B includes an encoding circuit which transforms the channel select signal into an address signal which can be utilized to address a memory, generally designated C. Memory C is preferably an electronically alterable, non-volatile, word erasable semiconductor memory having a plurality of storage locations. The number of storage locations provided in memory C corresponds to the number of different frequencies to which the varactor tuner, generally designated D, can be tuned. Each of the storage locations of memory is capable of storing a digital word in binary form. For instance, in this case, memory C has a hundred storage locations, each capable of storing a binary data word fourteen bits long. This number of storage locations provides adequate storage space for data corresponding to each of the 12 VHF channels as well as each of the seventy UHF channels and other storage functions.

The address signal generated by control logic B is transferred to display driver and a channel address circuit, generally designated E, wherein the address signal is decoded and used to drive display F which may be any one of a variety of conventional display devices. In addition, the decoded address signal is utilized to control the band select circuitry in varactor tuner D. The coded address signals are also utilized in display driver and channel address circuit E to drive an address circuit to select the storage location in memory C containing the digital data which coincides to the channel selected by actuation of keyboard A.

Control logic circuit B includes circuitry for controlling data flow from the addressed storage location in memory C, such that the data of the addressed storage location is sensed and temporarily stored in a section of circuit B. The stored data is processed and then the process signal, in the form of a pulse train having a duty cycle determined by the stored data, is transferred to the remaining portion of a digital to analog converter, generally designated G, which, in conjunction with delinearization circuit H will convert the digital word into a delinearized analog voltage. This voltage is utilized to corporally condition the varactor tuner selected desired frequency.

It should be noted that a fine tune means, generally desigted I, is operably connected to control logic circuit B, such that a data word temporarily stored therein may be altered prior to conversion into the tuning voltage in order that the varactor tuner D may be fine tuned. After the data is altered by the fine tune pulse generator I, the altered data automatically replaces the data in the addressed storage location in memory C, such that when the same channel is subsequently selected, the data word at the addressed location will reflect previous fine tuning adjustment. In this manner, the fine tune setting becomes a part of the data word, thereby preserving the fine tune setting of the selected channel for subsequent use.

The varactor tuner D utilizes the tuning signal to tune a resonant circuit by varying the capacitance of a voltage controlled diode which, along with an inductor, form the main components of the circuit. Theoretically, if the capacitance of the diode varied linearly with the input voltage thereto, the resonant frequency would change linearly with the changes in the input voltage. However, the characteristics of the varactor diodes do not change linearly over their entire range, but through a part thereof change approximately in accordance with a square law. Thus, unless this nonlinearity is compensated for, changes in tuning voltage may create variations in the tuned frequency which are not proportional thereto. The present invention is designed to overcome this difficulty.

Figure 2:
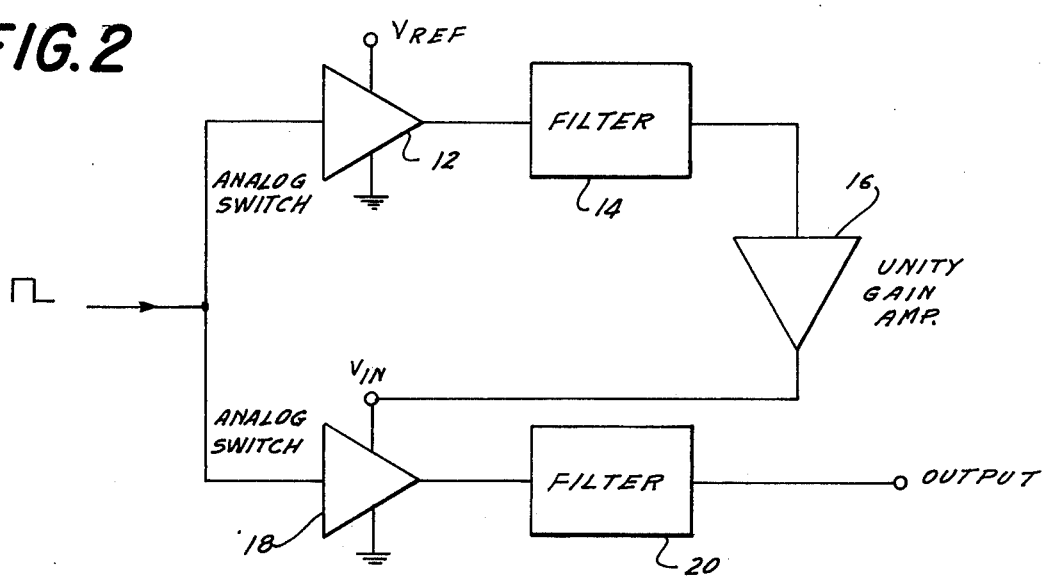
FIG. 2 is a block diagram of a first preferred embodiment of the delinearization circuit of the present invention.

FIG. 2 shows a block diagram of a portion of a digital analog converter having the first preferred embodiment of the delinearization circuit of the present invention therein. The circuit comprises an input node 10 which is connected to control logic circuit B to receive a constant frequency pulse train having a duty cycle variable in accordance with the temporarily stored data within circuit B. Thus, the input pulse train contains information concerning the value of the data at the addressed storage location in memory C.

Input node 10 is connected to the signal input of a first switch means, preferably in the form of an analog switch 12. Analog switch 12 generates a pulse train of a constant amplitude which varies between the supply voltage applied to its supply voltage input terminals, herein designated $V_{REF}$ and ground. Thus, the output of analog switch 12 is a first signal in the form of a pulse train having the same duty cycle as the input pulse at node 10 but with a constant amplitude of $V_{REF}$.

Analog switch 12 is connected to a filter 14 which is preferably a band pass filter of the RC type, having a relatively long time constant. Filter 14 forms, from the first signal generated by analog switch 12, an intermediate signal which is the time average of the first signal. The output of filter 14 is transferred to $V_{IN}$, one of the supply voltage input terminals of a second switch means, analog switch 18, through a unity gain amplifier 16. The other supply voltage input terminal of switch 18 is connected to ground. Unity amplifier 16 serves to compensate for the low input impedance of the $V_{IN}$ supply voltage input terminal of analog switch 18 which is connected to the output of filter 14. Amplifier 12 and filter 14 and unity gain amplifier 16 form the first stage of the circuit.

The signal input for the second analog switch 18 is also connected to input node 10 and thus, analog switch 18 has the same signal input as analog switch 12. This being the case, the output of analog switch 18 and the output of analog switch 12 will be precisely the same except for the amplitude thereof. Since the amplitude of the output of analog switch 18 varies between the respective voltages applied to its supply voltage input terminals, i.e., $V_{IN}$ and ground, the output of analog switch 18 will have a maximum amplitude of $V_{IN}$. However, since $V_{IN}$ is a function of the output of filter 14, which, in turn, is determined by the output of analog switch 12, the output of switch 18 will vary in proportion to the square of the input signal at input node 10, if the intermediate signal is the time average of the output of switch 12.

The output of analog switch 12 can be stated as follows:

$$S_{OUT} = DF \times V_{REF}$$

wherein $DF$ is a function of the duty cycle of the input pulse at input node 10, and $V_{REF}$ is the reference voltage applied to one of the supply voltage input terminals of analog switch 12, the other supply voltage input terminal being connected to ground. In a similar manner, the output of analog switch 18 is $$S_{OUT} = DF \times V_{IN}$$

wherein $DF$ is again a function of the duty cycle of the input pulse at input node 10 and $V_{IN}$ is the supply voltage applied to one of the supply voltage input terminals of analog switch 18, the other voltage input terminal being connected to ground. However, since the output of analog switch 12 is connected to the supply voltage input terminal of analog switch 18 through filter 14 and unity gain amplifier 16, the output of analog switch 18 can be given as follows:

$$S_{OUT} = DF \times V_{IN} = DF \times (DF \times V_{REF}) = (DF)^2 \times V_{REF}$$

as long as filter 16 time averages the output of switch 12. Thus, it can be seen that the output of analog switch 18 varies proportionally to the square of the function of the duty cycle of the input pulse.

The output of analog switch 18 is connected to a filter 20 which is preferably a low pass filter of the RC type having a relatively long time constant. Amplifier 18 and filter 20 form the second stage of the circuit. Filter 20 time averages the output pulse from analog switch 18 to form the tuning voltage which will condition the varactor tuner to select the desired frequency. Since the output of filter 20 and the characteristic of voltage control diodes both vary non-linearly in the same manner, namely approximately in the nature of a square law curve, at least over a substantial portion of the range thereof, the delinearization circuit will compensate (approximately) for the non-linearization of the voltage control diodes in varactor tuner D.

While it is true that the circuit shown in FIG. 2 compensates only approximately for the non-linearity of the voltage controlled diodes, this approximation is more accurate than if no delinearization circuit had been utilized. However, if even greater accuracy is required, the circuit of the second preferred embodiment, shown in FIG. 3, can be utilized. This circuit takes into account the fact that the tuner may perform approximately linearly through about the lower one-half of their operating ranges and thereafter act non-linearly in a manner similar to a square law curve. The circuit of FIG. 3 generates an output tuning voltage which is linearly proportional to the input pulse train for approximately one-half of the output range and which, thereafter, varies as a function of the square of the input pulse train.

Figure 3:
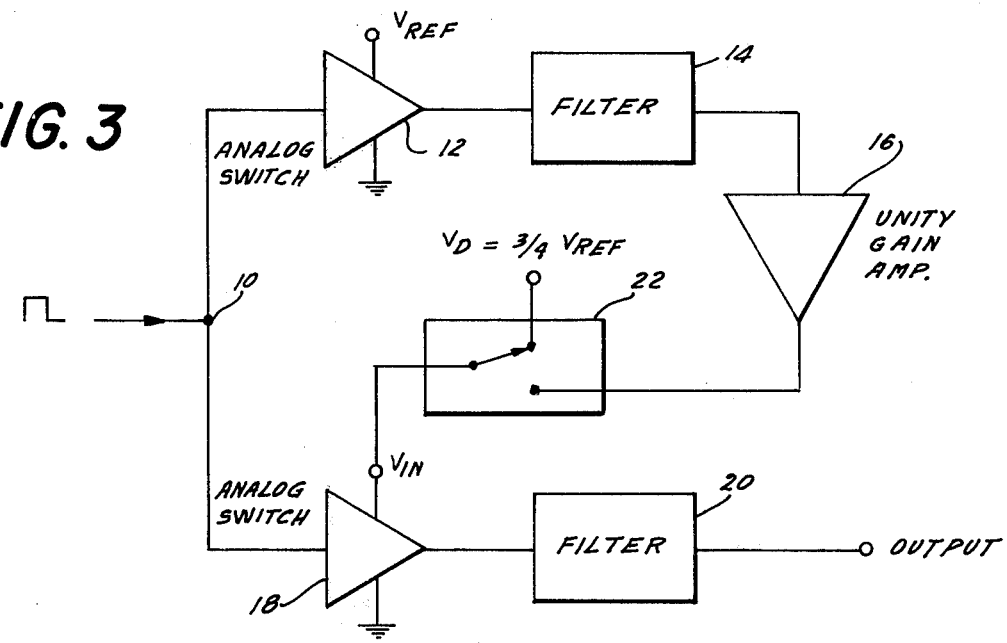
FIG. 3 is a block diagram of a second preferred embodiment of the delinearization circuit of the present invention.

In a manner similar to the circuit shown in FIG. 2, the circuit of FIG. 3 has an input node 10 which receives the variable duty cycle pulse train from circuit B and which is connected to the input of analog switch 12, the supply voltage input terminals thereof being connected between $V_{REF}$ and ground. Analog switch 12 generates an output pulse train having a duty cycle in accordance with the duty cycle of the input pulse train at node 10 but having a constant amplitude of $V_{REF}$. This signal is transferred to filter 14 which time averages the pulse train and transfers the time averaged signal to unity gain amplifier 16, which serves to compensate for the input impedance of the supply voltage input terminal of analog switch 18. Analog switch 18 has its signal input connected to node 10 such that it receives the pulse train input simultaneously with analog switch 12. The output from analog switch 18 is transferred to a filter 20 which time averages this output to form the tuning voltage which is, in turn, transferred to the varactor tuner to condition the tuner to selected desired frequency.

A switch circuit 22 in the form of a maximum value circuit is interposed between the stages of the circuit, namely, between the output of unity gain amplifier 16 and the supply voltage input terminal of analog switch 18. Switch circuit 22 is switchable between a voltage $V_D$, generated by a constant voltage source (not shown) and the output of unity gain amplifier 16. Switch circuit 22 selects the greater of these two voltages, and thus, the supply voltage input terminal of analog switch 18 will always be connected to $V_D$ or the output of unity gain amplifier 16, whichever is greater.

Since it is desirable to have the switchover point (between the linear and non-linear portions of the output curve) coincide approximately with the halfway point of the output voltage range (because this best approximates a curve which will compensate for the non-linearity of the voltage controlled diodes in the varactor tuner), $V_D$ is selected to be threequarters of the reference voltage. Selecting $V_D$ to equal ¾ $V_{REF}$ will place the switchover point at 9/16, or approximately half, the voltage output range.

As indicated above, the output of analog switch 18 equals:

$$S_{OUT} = DF \times V_{IN}$$

The switchover point will occur where $V_D$ equals the output of the unity gain amplifier. If $V_D$ is chosen to be ¾ $V_{REF}$, then the switchover point will occur when unity gain amplifier 16 is generating a signal which equals ¾ $V_{REF}$. This occurs when the duty cycle is at ¾ of its maximum value. Thus, the switchover point occurs when:

$$S_{OUT} = DF \times V_{IN} = ¾ \times ¾ V_{REF} = 9/16\ V_{REF}$$

Figure 4:
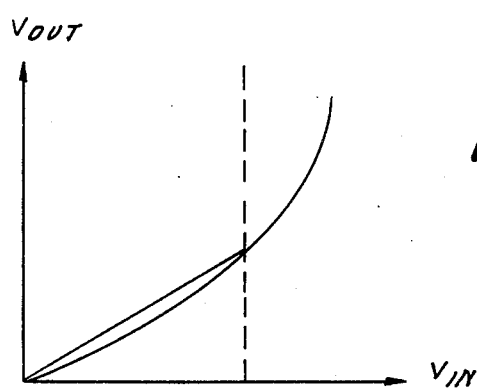
FIG. 4 is a graphical representation of the output characteristic of the circuit of FIG. 3.

Since 9/16 is approximately one-half of the input voltage range, choosing $V_D$ to equal ¾ $V_{REF}$ will permit the circuit of FIG. 3 to have an output curve similar to that shown in FIG. 4, i.e., linear from up to 9/16 of the voltage range and thereafter varying as the square of the input voltage. This is a good approximation of the non-linearity of the voltage controlled diodes in the varactor tuner and thus is suitable to compensate for the non-linearity thereof.

Figure 5:
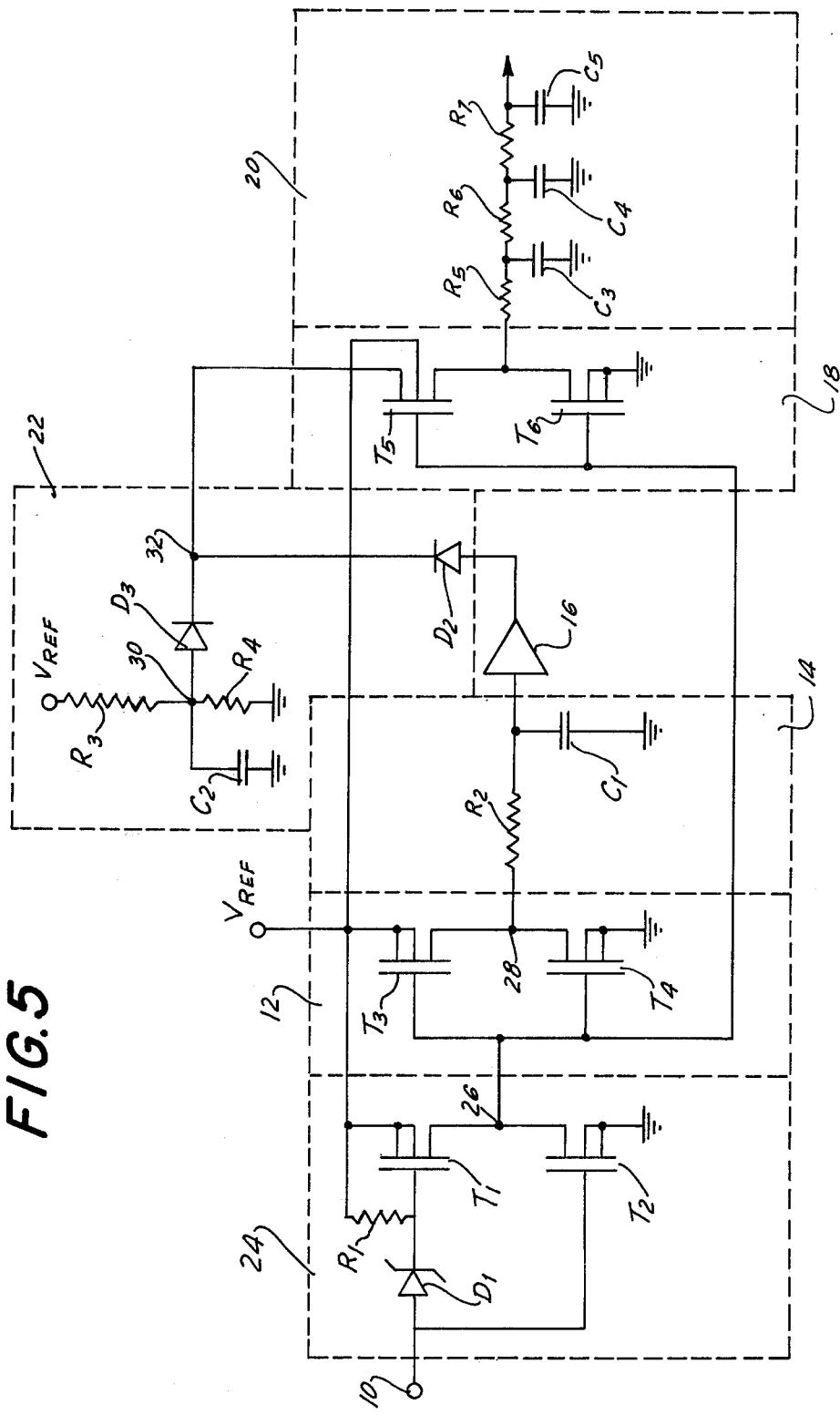
FIG. 5 is a schematic diagram of the circuit of FIG. 3.

FIG. 5 is a schematic diagram of the circuit of FIG. 3. This circuit forms a portion of the digital to analog converter which converts a switched 0 to 12 volt pulse train signal, for example, to an analog signal having a range between 0 to 30 volts. Because of the difference in the maximum voltage levels, it is necessary to buffer the input with a voltage translation inverting amplifier 24. Amplifier 24 is connected to input node 10 and consists of a pair of transistors $T_1$, $T_2$, the output circuits of which are connected series between the reference voltage, $V_{REF}$ and ground. A resistor $R_1$ is connected between the gate and the drain of transistor $T_1$. The gate of transistor $T_1$ is connected to input node 10 through a diode $D_1$. The gate of transistor $T_2$ is connected directly to the input node 10.

The output of amplifier 24 appears at a junction node 26 between the output circuits of transistors $T_1$ and $T_2$. Node 26 is connected to the input for analog switch 12 which consists of a pair of transistors $T_3$ and $T_4$. The output circuits of transistors $T_3$ and $T_4$ are connected in series between the reference voltage, $V_{REF}$ and ground. The gate of each of the transistors $T_3$ and $T_4$ is connected to node 26. The output of switch 12 appears at a junction node 28 between the output circuits of transistors $T_3$ and $T_4$.

Filter 14, which consists of a resistor $R_2$ and capacitor $C_1$, is connected to the output of switch 12 and receives the constant amplitude variable duty cycle pulse train from switch 12 and time averages the pulse train to form an intermediate signal which is transferred to unity gain amplifier 16. Unity gain amplifier 16 compensates for the low input impedance of the supply voltage input terminal of switch 18. The output of unity gain amplifier 16 forms one input for the switch circuit 22 which is preferably in the form of a maximum value circuit. Circuit 22 comprises diodes $D_2$ and $D_3$ as well as resistors $R_3$, $R_4$ and capacitor $C_2$. Node 30 is connected to the reference voltage, $V_{REF}$, through resistor $R_3$ and connected to ground through resistor $R_4$ and capacitor $C_2$. The values of these components are chosen such that the voltage on node 30 equals, for example, ¾ of the reference voltage $V_{REF}$. In this manner, the crossover point (between the linear and non-linear portions of the output) will occur approximately half-way along the voltage range, as explained in detail above. Diodes $D_2$ and $D_3$ are connected such that the greater of the voltage in node 30 or the voltage output in the amplifier 16 is connected to node 32 which forms the output of circuit 22.

Node 32 is connected to the supply voltage input terminal of analog switch 18 which consists of a pair of transistors $T_5$ and $T_6$. The voltage from node 32 forms the drain voltage for transistor $T_5$. The output circuits of transistors $T_5$ and $T_6$ are connected in series between node 32 and ground. The gates of transistors $T_5$ and $T_6$ are both connected to node 26 which is the output of amplifier 24. The output of switch 18 is the junction node between the output circuits of transistors $T_5$ and $T_6$, and this junction node is connected to form the input of filter 20.

Filter 20 consists of resistors $R_5$, $R_6$ and $R_7$, as well as capacitors $C_3$, $C_4$ and $C_5$ and acts as a low pass filter within a relatively long time constant. In the output of filter 20 will be a DC voltage, the amplitude of which varies linearly in accordance with the duty cycle of the pulse train at input node 10 until the switchover point determined by the maximum value circuit. Thereafter, the magnitude of the DC voltage varies as a function of the square of the duty cycle of the input pulse train. In this manner, the output of filter 20, which forms the tuning voltage to condition the varactor tuner, approximates the characteristics of the voltage control diodes in the varactor tuner, thereby compensating for the non-linearity of these components.

It should be appreciated that while the present invention has been illustrated for delinearizing an input signal in accordance with a square law curve, the delinearization may be achieved to any integral power. For instance, a cube law curve can be produced by adding a third stage consisting of a third switch means, preferably in the form of an analog switch and a third filter connected to the output thereof. The output of filter 20 would then be connected to the supply voltage input terminal of the third analog switch, the other supply voltage input terminal being connected to ground. The input signal terminal of the third amplifier would be operably connected to input node 10. This circuit would then have an output proportional to the cube of the input signal. Thus, it is obvious that by adding as many stages as is appropriate to the delinearization circuit of the present invention, an output curve delinearized to any integral power can be formed.

While only two embodiments of the present invention have been disclosed for purposes of illustration, it is obvious that many modifications and variations may be made on the specific structure disclosed. It is intended to cover all of these variations which fall within the scope of the invention as defined by the following claims.

What is claimed is:

1. A delinearization circuit comprising first switch means switchable, in accordance with an input signal, between a given voltage and a reference voltage to form a first signal, means for forming from said first signal an intermediate signal which is a function of said first signal, and second switch means switchable, in accordance with said input signal, between said intermediate signal and a reference signal, to form an output signal.

2. The circuit of claim 1 wherein said intermediate signal forming means comprises means for forming substantially the time average of said first signal.

3. The circuit of claim 2 wherein said switch means are analog switches.

4. A delinearization circuit comprising first switch means switchable, in accordance with an input signal, between a given voltage and a reference voltage to form a first signal, means for forming from said first signal an intermediate signal which is a function of said first signal, a voltage source, means for selecting one of said intermediate signal voltage and the voltage from said source, and second switch means switchable, in accordance with said input signal, between said selected voltage and a reference voltage, to form an output signal.

5. The circuit of claim 4 wherein said intermediate signal forming means comprises means for forming substantially the time average of said first signal.

6. The circuit of claim 4 wherein said switch means are analog switches.

7. An electronic tuning apparatus for use in a tuner or the like of the type having a tuning signal controlled tuning element, said apparatus comprising input signal generating means, a memory having a plurality of data storage locations, control means operatively connected to said input signal generating means for addressing a location in said memory in accordance with the generation of an input signal and for controlling data flow from said addressed location, means operatively connected to said memory for generating a signal variable in accordance with the data at said addressed location, means for delinearizing said variable signal to form a delinearized signal and means for forming the tuning signal from said delinearized signal.

8. The apparatus of claim 7 wherein said delinearizing means comprises first switch means switchable, in accordance with said variable signal, between a given voltage and a reference voltage to form a first signal, means for forming an intermediate signal which is a function of said first signal, and second switch means switchable, in accordance with said variable signal, between said intermediate signal and a reference voltage, to form said delinearized signal.

9. The apparatus of claim 8 wherein said intermediate signal forming means comprising means for forming substantially the time average of said first signal.

10. The apparatus of claim 8 wherein said switch means are analog switches.

11. The apparatus of claim 7 wherein said delinearization means comprises first switch means switchable, in accordance with said variable signal, between a given voltage and a reference voltage, to form a first signal, means for forming an intermediate signal which a function of said first signal, a voltage source, means for selecting the greater of said intermediate signal and said voltage from said source, second switch means switchable, in accordance with said variable signal, between said selected greater voltage and a reference voltage to produce said delinearization.

12. The apparatus of claim 11 wherein said intermediate signal forming means comprising means for forming substantially the time average of said first signal.

13. The apparatus of claim 11 wherein said switch means are analog switches.

* * * * *